United States Patent
Patel et al.

(10) Patent No.: US 7,289,321 B2
(45) Date of Patent: Oct. 30, 2007

(54) VENTILATED CASING FOR AN ELECTRONIC DEVICE

(75) Inventors: Chandrakant D. Patel, Fremont, CA (US); Wade D. Vinson, Magnolia, TX (US); Rich Bargerhuff, Spring, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 222 days.

(21) Appl. No.: 10/989,923

(22) Filed: Nov. 16, 2004

(65) Prior Publication Data

US 2006/0104028 A1    May 18, 2006

(51) Int. Cl.
*H05K 7/20* (2006.01)
(52) U.S. Cl. .................... 361/695; 454/184
(58) Field of Classification Search .............. None
See application file for complete search history.

(56) References Cited

U.S. PATENT DOCUMENTS

| | | | |
|---|---|---|---|
| 5,177,666 A | 1/1993 | Bland et al. | |
| 5,208,730 A * | 5/1993 | Tracy | 361/687 |
| 5,316,423 A * | 5/1994 | Kin | 411/510 |
| 6,351,380 B1 * | 2/2002 | Curlee et al. | 361/695 |
| 6,421,240 B1 | 7/2002 | Patel et al. | |
| 6,526,333 B1 | 2/2003 | Henderson et al. | |
| 6,601,168 B1 | 7/2003 | Stancil et al. | |
| 6,639,796 B2 * | 10/2003 | Cannon | 361/695 |
| 6,836,030 B2 | 12/2004 | Smith et al. | |
| 6,894,897 B1 * | 5/2005 | Nagurny et al. | 361/695 |
| 7,126,818 B2 * | 10/2006 | Lu et al. | 361/695 |
| 2002/0015287 A1 * | 2/2002 | Shao | 361/695 |
| 2003/0112601 A1 | 6/2003 | Smith et al. | |
| 2005/0063155 A1 * | 3/2005 | Endo et al. | 361/695 |

FOREIGN PATENT DOCUMENTS

| | | |
|---|---|---|
| DE | 10202814 | 8/2003 |
| GB | 2107787 | 5/1983 |
| JP | 5-167280 | * 2/1993 |
| WO | WO9304289 | 3/1993 |

* cited by examiner

*Primary Examiner*—Gregory D Thompson

(57) ABSTRACT

The present invention provides a ventilated casing for an electronic device. The ventilated casing includes a housing which has a ventilation inlet and a ventilation outlet. The ventilated casing also includes a high speed fan for moving air from the ventilation inlet to the ventilation outlet to dissipate heat that in use is generated by electronic components positioned in the housing. The fan has a blade, a motor and an air guiding portion positioned near the blade. The ventilated casing further includes a suspension for suspending the fan relative to the housing and for damping transmission of vibration originating from the fan.

16 Claims, 3 Drawing Sheets

VENTILATED CASING FOR AN ELECTRONIC DEVICE

FIELD OF THE INVENTION

The present invention relates to a ventilated casing for an electronic device and particularly, although not exclusively, to a ventilated casing for an electronic device having a high speed and high pressure fan.

BACKGROUND OF THE INVENTION

The ongoing performance increase of electronic devices usually requires an increase in device density. Large numbers of single electrical components are integrated to form an integrated component and many of such integrated components are placed into relatively small cases such as the cases of computer servers, laptop computers or other electronic devices.

For example, each casing for a server unit may be a narrow blade and a large number of such blades are positioned in close proximity in dedicated racks. A new generation of such blades has a thickness of only 1 U which corresponds to 1.75 inches or 4.445 cm. For example, a standard rack of 187 cm height is suitable to store 42 of such server blades on top of each other. Alternatively, the server blades may be vertical blades having a width of 1 U or less.

Such narrow blade servers increase the number of server components that may be placed in the rack if the package density of the electronic components in each casing can be increased. In order to guarantee satisfactory operation of the closely packed electronic components confined in such small spaces, heat developed by the electronic components needs to be dissipated.

Fans are usually used to dissipate heat developed by the electronic components of electronic server units. Fans of conventional electronic server units often have a normal operation speed which is only approximately 3600 rpm. However, if the package density and therefore the amount of heat that is generated per volume is further increased, higher mass flow is required to ensure that the electronic components are not overheated. Further, because of the increased package density, the flow resistance is also increased and a higher pressure needs to be provided in order to enable the higher mass flow and therefore avoid overheating. Accordingly, there is a need for an advanced technical solution.

SUMMARY OF THE INVENTION

Briefly, the present invention provides a ventilated casing for an electronic device. The ventilated casing includes a housing which has a ventilation inlet and a ventilation outlet. The ventilated casing also includes a high speed fan for moving air from the ventilation inlet to the ventilation outlet to dissipate heat that in use is generated by electronic components positioned in the housing. The high speed fan has a blade, a motor and an air guiding portion positioned near the blade. The ventilated casing further includes a suspension for suspending the fan relative to the housing and for damping transmission of vibration originating from the fan.

The invention will be more fully understood from the following description of embodiments of the ventilated casing. The description is provided with reference to the accompanying drawings.

DETAILED DESCRIPTION OF EMBODIMENTS

Figure 1A:
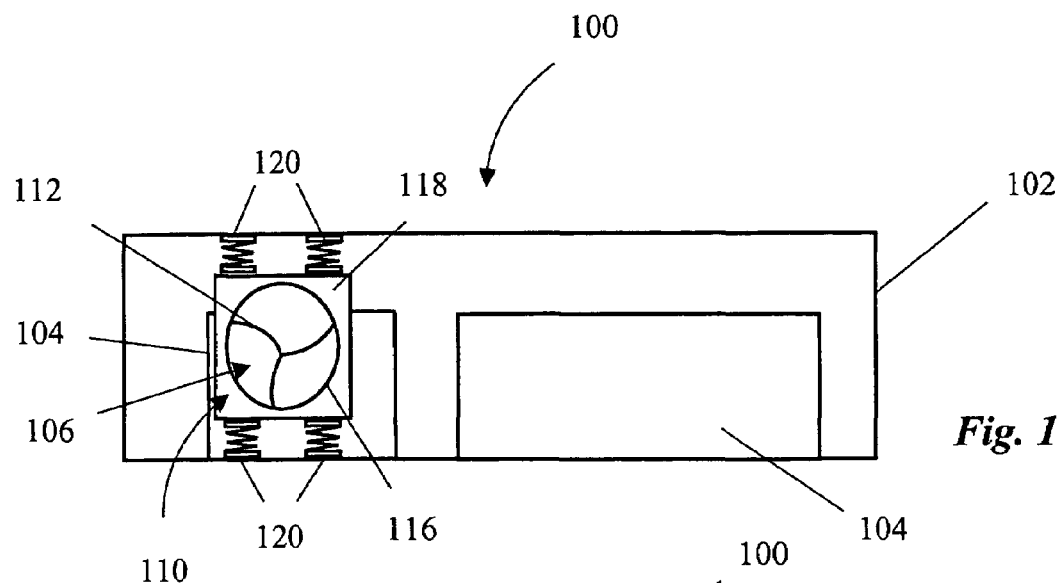
FIG. 1A is a rear view of a ventilated casing for an electronic device according to an embodiment of the invention.
Figure 1B:
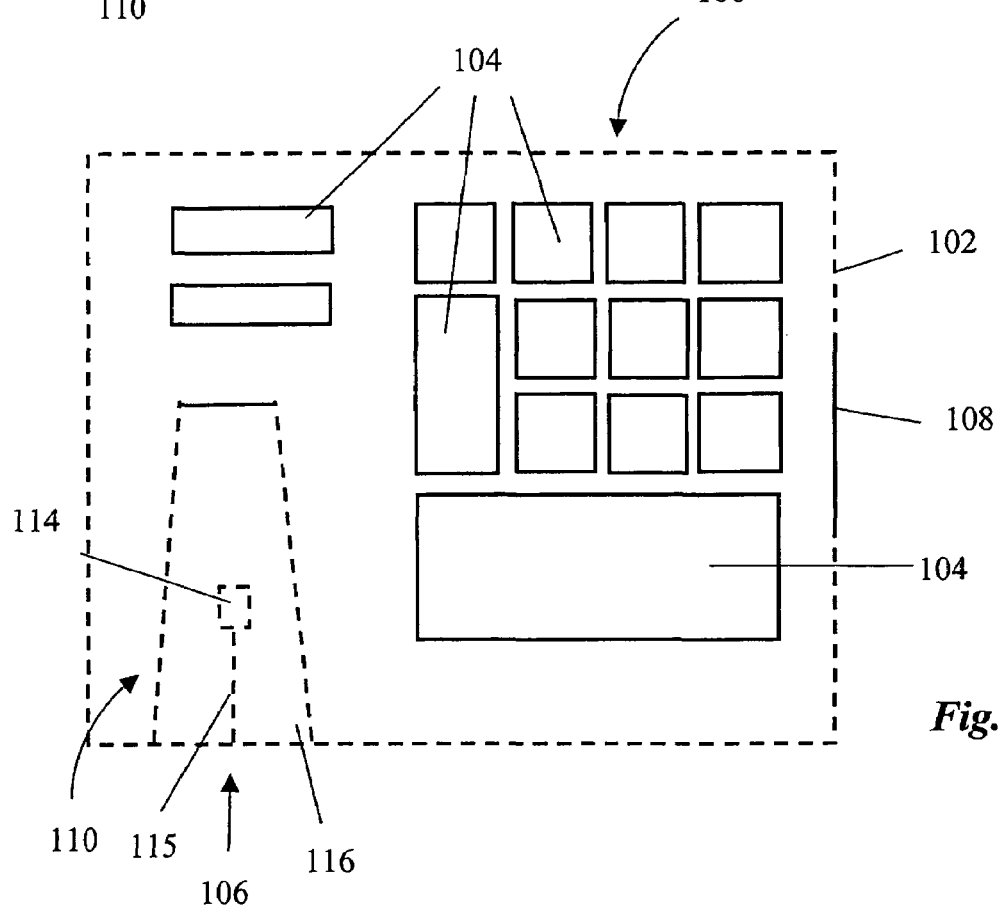
FIG. 1B is cross-sectional view of the ventilated casing shown in FIG. 1A.

Referring initially to FIGS. 1A and 1B, a ventilated casing for an electronic device according to an embodiment is now described. FIG. 1A shows a rear view of the interior of ventilated casing 100 for an electronic device and FIG. 1B shows a cross-sectional view of the ventilated casing 100. In this embodiment the ventilated casing 100 is provided with electronic components 104. The ventilated casing 100 with the electronic components 104 form an electronic device. The ventilated casing 100 includes a housing 102 in which the electronic components 104 are positioned. The housing 102 has air inlet opening 106 and an air outlet opening 108.

For example, the ventilated casing 100 may be a casing for a server blade which may be positioned, together with a large number of other blades, in a rack. In a specific example, the casing 100 has a height of 1 U which corresponds to 1.75 inches or 4.445 cm. The casing 100 typically includes a large number of the electronic components 104, such as server electronic components. Such a 1 U server blade has the advantage that it uses only minimum space. However, if the electronic components 104 are closely packed, the heat that is generated per volume may be substantial. In this case cooling provided by a conventional fan in a conventional ventilated casing may not be sufficient. Further, if the electronic components 104 are densely packed in the confined interior space of the housing 102, the air pressure of a conventional fan may not be sufficient.

In this embodiment, the ventilated casing 100 includes a high speed axial fan 110 having blades 112 on a shaft 115 coupled to motor a 114. The shaft 115 is supported in bearings by a support structure (not shown). The fan 110 also has an air guiding portion which in this embodiment is provided in form of a cowling 116 in which the support structure is positioned. The fan 110 is positioned in a fan casing 118. In this example the fan 110 has an operation speed of approximately 36,000 rpm. In general a suitable high speed fan has a normal operation speed that is greater than 3,600 rpm, such as greater than 10,000 rpm, 20,000 rpm or 30,000 rpm. Because of the high speed, the fan 110 provides high mass flow of cooling air. In a variation of this embodiment, the casing 100 may include two or more fans 110 which would provide even more cooling air. Further, in this embodiment the fan 110 has relatively deep blades 112 (the fan 110 has depth that is larger than the width of the fan 110). Consequently, due to the depth of the blades 112, high pressure is provided for ventilating densely packed casings.

In use, the fan 110 transports ventilation air from ventilation inlet opening 106 through the interior space of the ventilated casing 100 and through the ventilation opening 108. However, in operation the "turbine" fan 110 develops a relatively loud and disturbing noise. For example, if the fan 110 operates at a speed of 36,000 rpm, which corresponds to 600 rotations per second, mechanical vibrations having a frequency of approximately 600 Hertz are generated which causes the noise.

Fans of existing electronic devices often also cause vibrations, but since they operate at speeds that are significantly lower, typically of the order of 3600 rpm, the frequency of the vibration is much lower (60 Hertz), coupling of the vibration with surrounding parts is less likely and the generated noise is less disturbing. The noise having a frequency of approximately 600 Hz that is generated by the fan 110 of the ventilated casing 100, however, is in a frequency range to which the human ear has a relatively high sensitivity. Further, mechanical components of the ventilated casing 100 may have resonant frequencies that are in the proximity of this frequency and their vibrations would cause an amplification of the noise.

To reduce transmission of vibrations from the fan 110 to other components, such as the electronic components 104 or the housing 102, in this embodiment the fan 110 is suspended by suspension elements 120. The suspension elements 120 are positioned between the housing 102 and a fan casing 118. In this example, pairs of the suspension elements 120 suspend the fan casing 118 from opposite sides of the fan and reduce transmission of a vibration from the fan 110 and thereby reduce the noise. Consequently, the ventilated casing 100 has the significant advantage in that sufficient cooling for densely packaged electronic components 104 may be provided while the noise of the fan is significantly reduced.

In this embodiment the suspension elements 120 include a flexible material and each suspension element includes a coil spring and a flexible polymeric material for damping the spring oscillation. Each suspension element 120 has a first portion that is connected to the housing 102 and a second portion that is connected to the fan housing 118.

In variations of this embodiment the suspension elements 120 may include other types of springs, such as leave or beam springs. Further, the damping material may also be formed from any suitable polymeric material. It is to be appreciated that the suspension elements may alternatively include only either the spring or the damping material and not necessarily both. Further, the ventilated casing 100 may include any number of suspension elements which may not necessarily be positioned between the fan casing 118 and the housing 102. For example, only one or two suspension elements may suspend the fan 110 from either a top or a bottom portion of the fan 110 and the suspension elements could also be positioned in the fan housing 118 or outside the housing 102.

Figure 2:
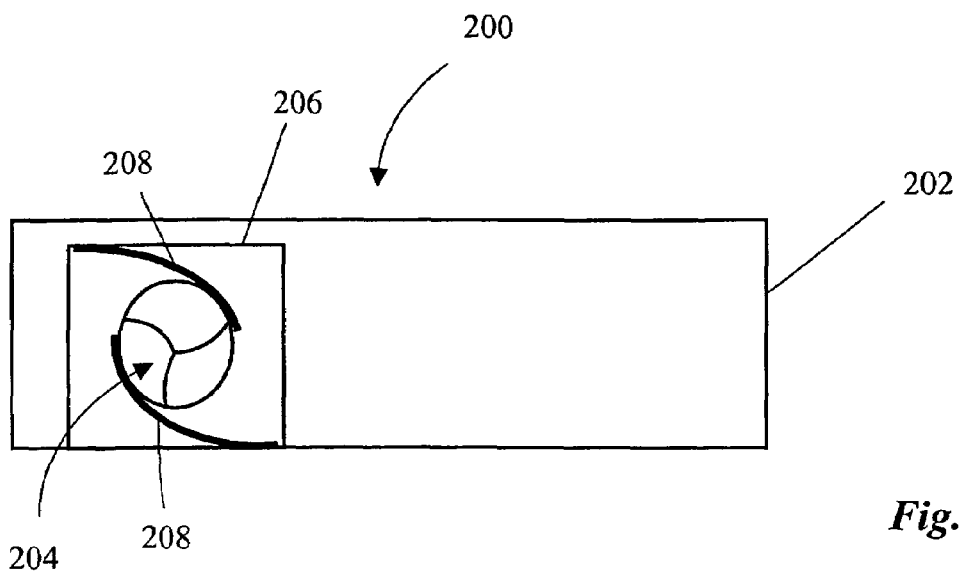
FIG. 2 is a rear view of a ventilated casing according to another embodiment of the present invention.

FIG. 2 shows a rear view and the interior of a ventilated casing according to a further embodiment. In this case, the ventilated casing 200 also includes a housing 202 and a high speed fan 204 which is identical with the fan 110 shown in FIGS. 1A and 1B. In this embodiment the fan 204 is suspended in a fan casing 206 by two suspension elements 208. The suspension elements 208 are leave springs which in this example are composed of steel. Alternatively, the leave springs may be formed from another suitable material such as a plastics material.

Figure 3:
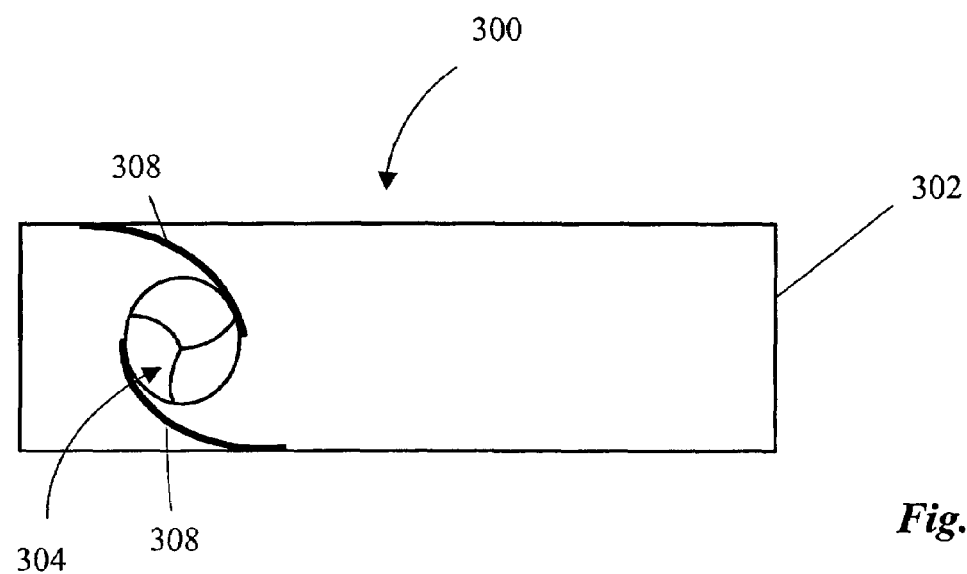
FIG. 3 is a rear view of a ventilated casing according to a further embodiment of the present invention.

FIG. 3 shows a rear view and the interior of a ventilated casing according to a another embodiment. The ventilated casing 300 includes a housing 302 and a high speed fan 304 which is identical with the fan 110 shown in FIGS. 1A and 1B. The fan 304 is suspended by two suspension elements 308. In this embodiment the suspension elements 308 are leave springs and are in this example are integrally formed with the housing which has the advantage of reduced production costs. For an example, the suspension elements 308 may be formed by stamping small cantilevered-shaped leave springs from the housing material. Finite Element Analysis techniques can be employed to created suitable net shapes to achieve the desired spring characteristics. The fan 304 and the suspension elements 308 may have a snap-fitting so that the fan 308 may be snap-fitted into place. Alternatively the suspension elements 308 may be integrally formed with the fan. In this case the housing 302 and the suspension elements 308 may have a snap-fitting so that the fan 304 with suspension elements 308 may be snap fitted into the housing 302.

Figure 4:
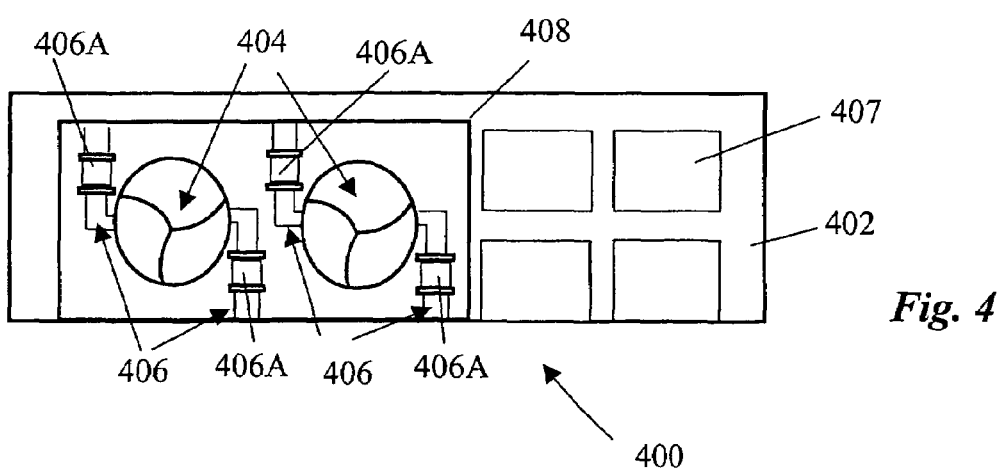
FIG. 4 is a rear view of a ventilated casing according to yet another embodiment of the present invention.

FIG. 4 shows a rear view of the interior of a ventilated casing 400 according to a further specific embodiment. In this embodiment, the ventilated casing 400 includes electronic components 407 and a pair of fans 404, each identical with fan 204 or fan 110 as discussed above. Each fan 404 is suspended by suspension elements 406 in a fan casing 408. In this example, the suspension elements include a flexible polymeric material 406 A which reduces transmission of a vibration originating from the fan. It is to be appreciated that alternatively or additionally the suspension portion 406A may also include springs. Further, the suspension portion 406A may include any other suitable flexible material.

Figure 5:
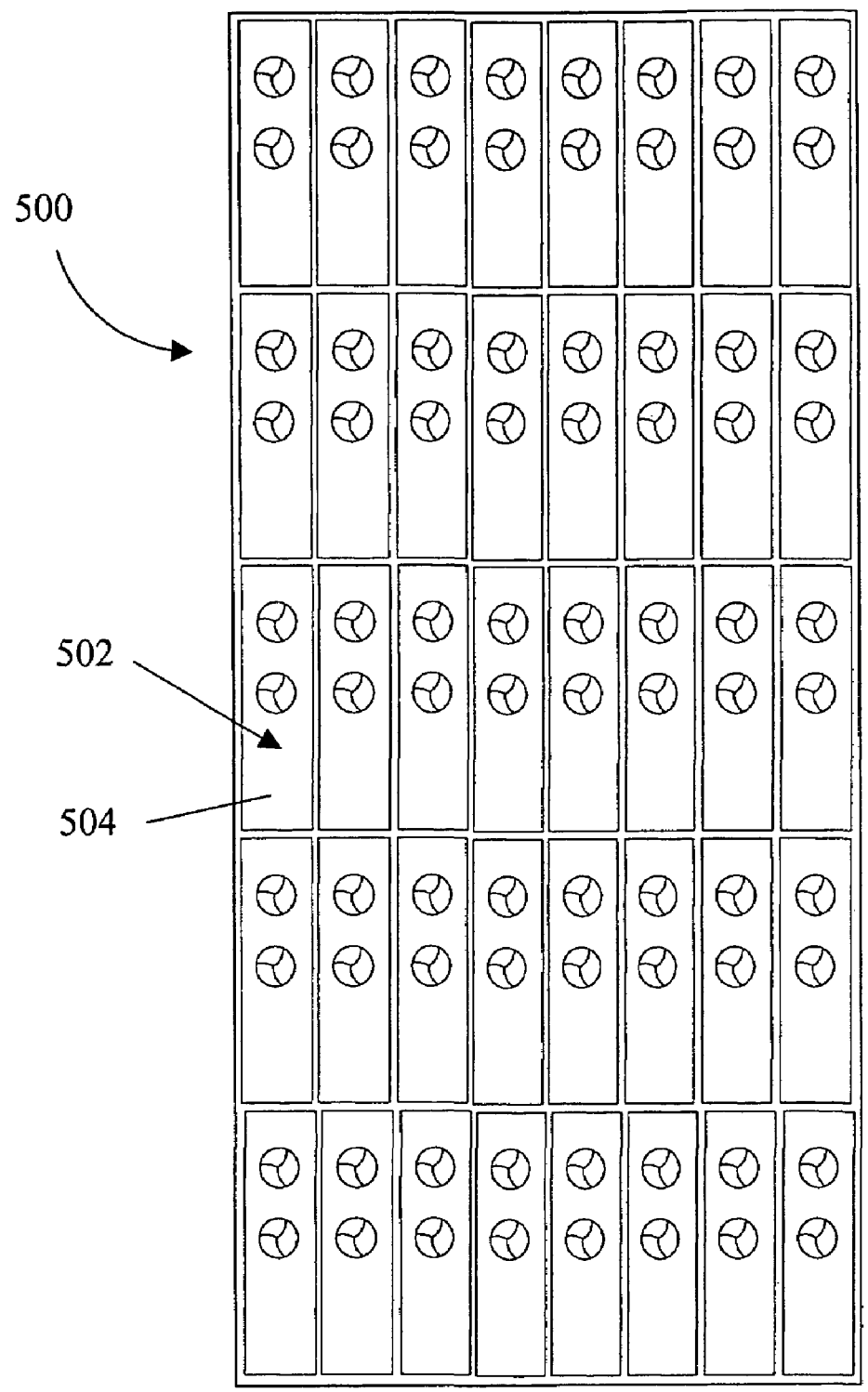
FIG. 5 is a rear view of a rack with ventilated casings for electronic devices according to further embodiment of the present invention.

FIG. 5 shows a rear view of a rack 500 including a plurality of server blades 502. Each server blade 502 includes a ventilated casing 504 that is identical with the ventilated casing 400 shown in FIG. 4. In this embodiment, a large number of the server blades 502 are positioned closely packed in the rack 500.

Although the invention has been described with reference to particular examples, it will be appreciated by those skilled in the art that the invention may be embodied in many other forms. For example, any type of suspension that damps transmission of vibrations originating from the fan may be used. Further, it is to be appreciated that the fan may not necessarily be a high speed and high pressure fan of the type discussed above and may also not necessarily include a cowling. For example, if the electronic components are less densely packed, it would be sufficient to use a fan that operates at a lower speed and provide less pressure. Also more than one fan may be stacked behind each other. In addition, the ventilated casing may not necessarily be a casing that is arranged to be positioned in a rack such as rack 400. For example, in an alternative embodiment, the ventilated casing may be a casing of a laptop computer or may be of any other shape or size. Further, in variations of the described embodiments the fan does not necessarily include a fan casing.

What claimed is:

1. A ventilated casing for an electronic device, the ventilated casing comprising:
   a housing having a ventilation inlet and a ventilation outlet;
   a fan for moving air from the ventilation inlet to the ventilation outlet to dissipate heat that in use is generated by electronic components positioned in the housing, the fan having a blade, a motor and an air guiding portion positioned near the blade; and
   a suspension for suspending the fan relative to the housing and for damping transmission of vibration originating from the fan, the suspension including one or more suspension elements, the one or more suspension elements structurally suspending the fan in isolation from the housing.

2. The ventilated casing of claim 1 wherein:
at least one suspension element of the one or more suspension elements comprises a polymeric damping material.

3. The ventilated casing of claim 1 wherein:
at least one suspension element of the one or more suspension elements comprises a coil spring.

4. The ventilated casing of claim 1 wherein:
at least one suspension element of the one or more suspension elements is positioned between the fan case and the housing.

5. The ventilated casing of claim 1 wherein:
the suspension is integrally formed with the housing.

6. The ventilated casing of claim 1 wherein:
the suspension is integrally formed with the fan.

7. The ventilated casing of claim 1 wherein:
the suspension comprises a plurality of suspension elements.

8. The ventilated casing of claim 7 wherein:
the suspension suspends the fan from opposite sides of the fan.

9. The ventilated casing of claim 1 wherein:
the fan blade is deeper than it is wide; and
the air guiding portion is a cowling that surrounds the blade.

10. The ventilated casing of claim 9 wherein:
the fan is an axial fan having an operating speed of more than 10.000 rpm.

11. The ventilated casing of claim 9 wherein:
the fan is an axial fan having an operating speed of more than 15,000 rpm.

12. The ventilated casing of claim 9 wherein:
the fan is an axial fan having an operating speed of more than 30,000 rpm.

13. A blade casing for an electronic device, the blade casing comprising:
a housing having a ventilation inlet and a ventilation outlet;
a fan for moving air from the ventilation inlet to the ventilation outlet to dissipate heat that in use is generated by electronic components positioned in the housing, the fan having a blade, a motor and an air guiding portion positioned near the blade; and
a suspension for suspending the fan relative to the housing and for damping transmission of vibration originating from the fan, the one or more suspension elements structurally suspending the fan in isolation from the housing.

14. The blade casing of claim 13 wherein:
the housing has substantially the shape of a rectangular prism and is shaped for placement in a 1 U rack system.

15. An electronic device comprising:
a housing having a ventilation inlet and a ventilation outlet;
electronic components positioned in the housing;
a fan for moving air from the ventilation inlet to the ventilation outlet to dissipate heat that in use is generated by the electronic components positioned in the housing, the fan having a blade, a motor and an air guiding portion positioned near the blade; and
a suspension for suspending the fan relative to the housing and for damping transmission of vibration originating from the fan, the suspension including one or more suspension elements, the one or more suspension elements structurally suspending the fan in isolation from the housing.

16. A method of cooling electronic components in a housing, the method comprising the steps of:
directing air from a ventilation inlet to the ventilation outlet of the housing to dissipate heat generated by the electronic components, the air being directed using a fan, and damping transmission of a vibration originating from the fan using a suspension for suspending the fan relative to the housing, the suspension including one or more suspension elements, the one or more suspension elements structurally suspending the fan in isolation from the housing.

* * * * *

UNITED STATES PATENT AND TRADEMARK OFFICE
CERTIFICATE OF CORRECTION

| | | |
|---|---|---|
| PATENT NO. | : 7,289,321 B2 | Page 1 of 1 |
| APPLICATION NO. | : 10/989923 | |
| DATED | : October 30, 2007 | |
| INVENTOR(S) | : Chandrakant D. Patel et al. | |

It is certified that error appears in the above-identified patent and that said Letters Patent is hereby corrected as shown below:

In column 5, line 31, in Claim 10, delete "10.000" and insert -- 10,000 --, therefor.

Signed and Sealed this

Thirtieth Day of June, 2009

JOHN DOLL
*Acting Director of the United States Patent and Trademark Office*